United States Patent [19]

Hynecek

[11] 4,140,814

[45] Feb. 20, 1979

[54] PLASMA DEPOSITION OF TRANSPARENT CONDUCTIVE LAYERS

[75] Inventor: Jaroslav Hynecek, Dallas, Tex.

[73] Assignee: Texas Instruments Incorporated, Dallas, Tex.

[21] Appl. No.: 856,445

[22] Filed: Dec. 1, 1977

[51] Int. Cl.$^2$ ............................................. B05D 3/06
[52] U.S. Cl. .................................... 427/39; 427/164; 427/166
[58] Field of Search ............... 427/38, 39, 40, 41, 427/164, 165, 166, 167; 204/164, 165, 168

[56] References Cited

U.S. PATENT DOCUMENTS

| | | | |
|---|---|---|---|
| 3,243,363 | 3/1966 | Helwig | 427/39 |
| 3,808,035 | 4/1974 | Stelter | 427/166 |
| 3,991,228 | 11/1976 | Carlson et al. | 427/39 |

*Primary Examiner*—John H. Newsome
*Attorney, Agent, or Firm*—James T. Comfort; Gary C. Honeycutt

[57] ABSTRACT

A transparent conductive layer of $SnO_2$ is deposited on a substrate by an RF-plasma assisted chemical vapor reaction of $CO_2$ with an organic tin compound, such as tetramethyl tin, for example. A CCD optical imager is fabricated, using the method of the invention to form a transparent conductive layer thereon.

6 Claims, No Drawings

PLASMA DEPOSITION OF TRANSPARENT CONDUCTIVE LAYERS

BACKGROUND OF THE INVENTION

The present invention pertains to the deposition of transparent conductive layers, and more particularly to an improved charge-coupled optical imager having transparent conductive phase electrodes formed thereon by the plasma deposition of $SnO_2$.

There are many applications which require the use of a layer of material which is both conductive as well as optically transparent, for example, solar cells, photodetectors, and semiconductor optical imagers. Frontside illuminated, semiconductor optical imagers, for example, require the use of conductive electrodes that completely cover the active surface of the device, but through which optical information must be allowed to pass for operation of the device. Metal oxide materials such as tin oxide and indium oxide are commonly used for this purpose.

Typically, tin oxide layers have been deposited by pyrolysis reactions, hydrolysis, R-F sputtering or CVD. Such processes have generally required high temperatures, and have not provided adequate uniformity of thickness or composition for purposes of fabricating CCD optical imaging devices.

Accordingly, it is a primary object of this invention to provide a low-temperature process for depositing $SnO_2$ layers of uniform composition and thickness.

One aspect of the invention is embodied in a plasma deposition process which includes the step of exposing a suitable substrate to a reduced-pressure environment of $CO_2$ and an organic tin compound, in the presence of an RF glow discharge, at a temperature preferably between 200°–500° C., although temperatures outside this range may also be suitable for certain purposes.

RF power densities in the range of 1–3 milliwatts per $cm^3$ are generally suitable, and preferably about 1.3–1.7 milliwatts per $cm^3$.

Reduced pressures in the range of 0.1 to 2.0 Torr are generally suitable, and preferably less than 1.0 Torr.

Tin compounds useful in the process include primarily the lower alkyl tin compounds, from methyl to butyl. Preferably tetramethyl tin is employed, because it provides superior control over the deposition rate, and its vapor pressure permits a convenient supply system. The ratio of $CO_2$ to tin compound is between 50:1 and 300:1, preferably 100:1 to 250:1.

The chemistry of the reaction is substantially as follows:

A CCD imager having one or more phase electrodes fabricated by the process of the invention includes a channel region defined in a semiconductor substrate, peripherally bounded by channel stop regions. Also included is an appropriate structure for inputting signals, in the form of charged packets, into the channel beneath one or more selected phase electrodes. These charged packets are propagated along the channel by suitable clock pulses applied to phase electrodes located above the channel and insulated from the semiconductor surface, the charge packets being extracted as output signals by suitable output structure. As thus far described, the CCD imager structure and method of fabricating it are known in the art, see for example U.S. Pat. No. 4,024,563 and U.S. Pat. No. 4,027,382. Since they do not form part of the present invention, they will not be further described.

A suitable reactor for use in practicing the invention in disclosed in U.S. Pat. No. 3,757,733, incorporated herein by reference.

The process of the invention was carried out as follows to coat a CCD imager with a layer of $SnO_2$:

Power; 12W (1.5 milliwatts $cm^3$)
Temperature; 380° C.
Pressure; 0.31 Torr
$CO_2$; 0.75 liter/minute
$Sn(CH_3)_4$; 0.0033 liter/minute
Deposition Rate; 24 Å per minute At the end of 90 minutes deposition, the $SnO_2$ layer was found to be 2160 Å thick.

While particular embodiments of this invention have been disclosed herein, it would be understood that various modifications may become apparent to those skilled in the art without departing from the spirit and scope of the invention which is defined by the appended claims.

What is claimed is:

1. A method for the deposition of a transparent conductive layer of tin oxide on a substrate, comprising the step of exposing said substrate to a vaporous or gaseous mixture of carbon dioxide and an organic tin compound, while maintaining reduced pressure and an RF glow discharge in the vicinity of said substrate at an energy level sufficient to cause interaction of said mixture and consequent deposition of tin oxide.

2. A method as in claim 1 wherein said substrate is maintained at a temperature of 200°–500° C.

3. A method as in claim 1 wherein the RF power is 1–3 milliwatts per $cm^3$.

4. A method as in claim 3 wherein the pressure is less than 1.0 Torr.

5. A method as in claim 1 wherein the ratio of $CO_2$ to organic tin is between 50:1 and 300:1.

6. A method as in claim 1 wherein said substrate is a CCD imager.